United States Patent [19]

Browne et al.

[11] 4,261,584
[45] Apr. 14, 1981

[54] HERMETIC SEAL

[75] Inventors: Kenneth P. Browne; Bernard T. Carr, both of Poughkeepsie; Edward J. Romanski, Wappingers Falls, all of N.Y.

[73] Assignee: International Business Machines Corporation, Armonk, N.Y.

[21] Appl. No.: 95,983

[22] Filed: Nov. 19, 1979

[51] Int. Cl.³ .................... F16J 15/12; F16J 15/32
[52] U.S. Cl. ........................... 277/206 R; 277/235 R
[58] Field of Search ........................ 277/206, 235 B

[56] References Cited
U.S. PATENT DOCUMENTS

| 3,163,431 | 12/1964 | Tanner | 277/206 |
| 3,519,278 | 7/1970 | Fuhrmann et al. | 277/235 |
| 3,740,062 | 6/1973 | Robins | 277/235 B |

Primary Examiner—Robert I. Smith
Attorney, Agent, or Firm—D. R. McKechnie

[57] ABSTRACT

A hermetic seal is provided between opposing surfaces of a two part housing containing highly permeable fluids. A three element seal, located between the surfaces to be sealed, consists of a spring metal C-ring having a ductile metal coating on at least the surfaces thereof which are to contact the surfaces to be sealed, and an organic material coating applied at least to the ductile metal coated surfaces which contact the surfaces to be sealed. Pressure is applied to the coated C-ring by the surfaces to be sealed causing the organic material to fill any microvoids or scratches in the sealing surfaces, and causing the ductile metal coating to fill the larger voids and discrepancies, thereby, forming an impermeable leakage barrier for the highly permeable fluids contained within the housing.

10 Claims, 4 Drawing Figures

HERMETIC SEAL

DESCRIPTION

1. Technical Field

This invention relates to a hermetic seal for a two part housing containing permeable fluids, and more particularly, to a hermetic seal which is breakable and restorable without surface refinishing and is still capable of providing long term sealing of highly permeable fluids with a negligible leak rate.

In connection with electronic modules and the like, it is necessary to provide a long term hermetic seal for highly permeable fluids which is breakable and restorable many times during the lifetime of the module without requiring refinishing or reconditioning of the surfaces to be sealed. This is accomplished by adding an organic material to a ductile metal coating on a spring metal C-ring which under pressure not only provides lubrication so that uniform distortion of the spring metal ring takes place, but in combination with the ductile metal coated spring metal C-ring provides an impermeable barrier to the contained highly permeable fluids.

2. Background Art

Spring metal C-rings having a ductile metal coating thereon are well known for use in providing a seal for fluids under high pressure. The high pressure fluids exert a force against the inside of the C-shaped ring, which force is transferred to the surfaces abutting the seal against which sealing is to take place. These high forces pressing the periphery of the seal ring against the surfaces to be sealed cause a cold flowing of the ductile metal coating so that it fills voids and scratches in the surfaces against which sealing is to take place. The usual seals made of rubber or plastic could not be used in these high pressure situations because of their inability to withstand the high forces caused by the high pressure of the contained fluid.

The development of integrated circuits has required the development of newer cooling techniques, since the large number of circuits in a small area generate a considerable amount of heat which must be dissipated for proper operation of the components on the chip, such as transistors. In this connection, U.S. Pat. No. 3,993,123 discloses a module containing a number of integrated circuit chips. The housing or module contains helium gas which provides a better heat conductive path across various interfaces within the module than can be obtained by air. The module must be sealed against leakage of the gas for a period greater than ten years, and must provide a seal that can be broken and restored a number of times for repair purposes without requiring the refinishing of the sealing surfaces. The usual rubber or plastic seals such as O-rings proved to be ineffective since the fluids such as helium are highly permeable, thus, passing through these materials. The above-mentioned spring metal C-rings such as disclosed in U.S. Pat. No. 3,163,431 having a ductile metal coating on the peripheral portions which engage the surfaces against which sealing is to take place were found to have too great a leak rate for containing highly permeable fluids and also required a refinishing of the surfaces to be sealed when breaking and restoring of the seals was required.

DISCLOSURE OF THE INVENTION

In accordance with the present invention, a long term hermetic seal for highly permeable fluids is obtained, which is breakable and restorable without surface refinishing and loss of hermeticity capability by adding an organic material coating to the spring metal C-shaped ring having the ductile metal coating thereon. The organic material coating is located on at least the ductile metal coated surfaces which are to contact the surfaces against which sealing is to take place. Pressure is applied to the dual coated C-ring by external means, which forces the surfaces against which sealing is to take place against the C-ring, thereby causing the organic material to fill any micro voids or scratches in the sealing surfaces, and causing the ductile metal coating to fill the larger voids and discrepancies to form an impermeable leakage barrier for highly permeable fluids contained within the housing.

The main advantage of the hermetic seal is that an impermeable barrier is formed capable of containing highly permeable fluids for more than ten years with a negligible leak rate. A further advantage is that the hermetic seal may be broken and restored many times without requiring sealing surface refinishing or effecting the long term leak rate.

Another advantage is that the hermetic seal is capable of containing the permeable fluids when the sealing surfaces consist of metals having different coefficients of expansion and the arrangement is operated over a large temperature range.

BRIEF DESCRIPTION OF THE DRAWINGS

Details of our invention will be described in connection with the accompanying drawings.

BEST MODE FOR CARRYING OUT THE INVENTION

Figure 1:
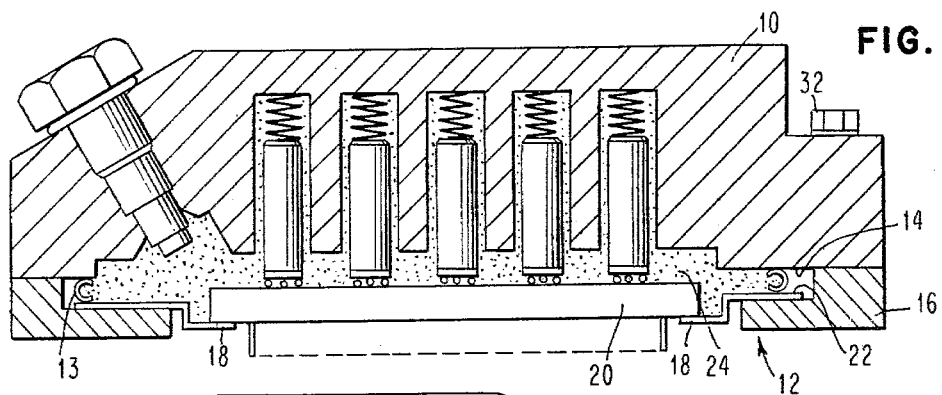
FIG. 1 is a vertical cross-sectional view through a gas encapsulated module having two parts, and showing the C-ring seal between the two housing parts.

Referring to FIG. 1, there is shown a gas encapsulated module having a first housing half or cap 10 which is sealed to a second housing half 12. A dual coated C-shaped ring 13 is shown between the two housing halves 10 and 12 to provide sealing such that a highly permeable fluid, such as helium gas, is maintained within the module. The cap 10 is forced against the C-shaped seal ring until the sealing surface 14 comes in contact with the top surface of the base plate 16. The cover or cap 10 is made of aluminum or other good heat conducting material. The surface 14 can be plated with a soft metal such as gold. This improves the seal obtained between the surfaces to be sealed. A metal flange 18 extends from the bottom of the ceramic substrate 20 to a ridge on the base plate 16. The surface 22 of the metal flange can likewise be plated with a soft material such as gold to improve the seal obtained thereagainst. The dual coated C-shaped ring extends between the bottom surface 14 of the cap and the top surface 22 of the metal flange. The ring is designed to provide hermetic sealing between the sealing surfaces 14 and 22.

This seal maintains the highly permeable helium gas 24 within the module.

Figure 2:
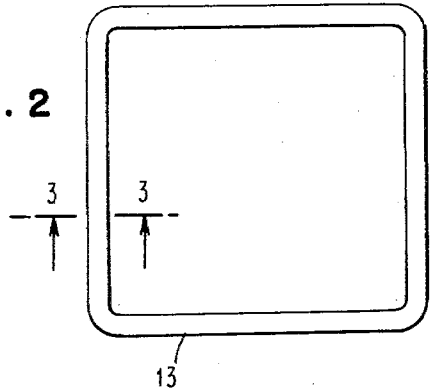
FIG. 2 is a plan view of the C-shaped sealing ring.
Figure 3:
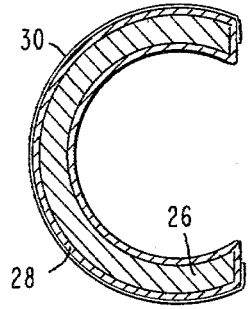
FIG. 3 is a blown-up cross-sectional view along the lines 3—3 of FIG. 2.

FIG. 2 is a plan view showing the general shape of the dual coated C-shaped ring 13 used in the housing shown in FIG. 1. The cross-section of the ring is shown in FIG. 3. The base or core 26 of the C-shaped ring is made of a spring metal material such as spring steel. The sealing ring has a C-shape such that the top and bottom of the ring make line contact with the surfaces to be sealed before any squeezing or pressure is applied. The C-ring is made of spring material so that the pressure will be continually applied against the sealing surfaces even when there are changes between the surfaces due to different rates of expansion and contraction of the different materials during heat cycling. The core 26 of the C-shaped ring has a coating of ductile metal 28 on the surface thereof, at least in the areas where the C-shaped ring is to be in contact with the surfaces to be sealed. This ductile metal 28 is preferably lead but may be of any soft malleable metal such as gold, silver, etc. The soft ductile metal coating 28 tends to flow into the various sealing surfaces discrepancies under pressure. It has been found that the ductile metal 28, such as lead, does not flow into the micro voids and minute scratches that exist even on a polished surface, thereby, providing minute leak paths for highly permeable gases such as helium. It was also noted that the sealed housing using the spring metal, lead-coated ring provides a very poor initially, that is, after the pressure is applied to the seal, considerable time must be allowed for the cold flow of the ductile metal 28 into the various surface discrepancies. As can be seen in FIG. 3, a coating of an organic material 30, such as wax, is added to the ductile metal coated ring 13. The organic material 30 is applied at least in the area which will be contacting the surfaces to be sealed, when pressure is applied. Other organic materials 30 may be used such as the well known thermal greases. The organic material coating 30 provides lubrication to the spring metal seal 13 when pressure is applied, such that the squeezing or pressure will not cause binding, and thus distortion of the ring. The most important quality of the organic material 30 is that under pressure, the organic material 30 immediately flows into the minute micro-voids and scratches in the surfaces to be sealed, thus providing a barrier to the leakage mentioned above. Once the organic material 30 has flowed into the micro-voids and scratches, the ductile metal 28 then forms into the larger discrepancies in the surfaces. The combination of the base ring 26, the organic material 30 and the ductile metal 28 forms an impermeable barrier to the leakage of the contained permeable fluid, such as helium.

Figure 4:
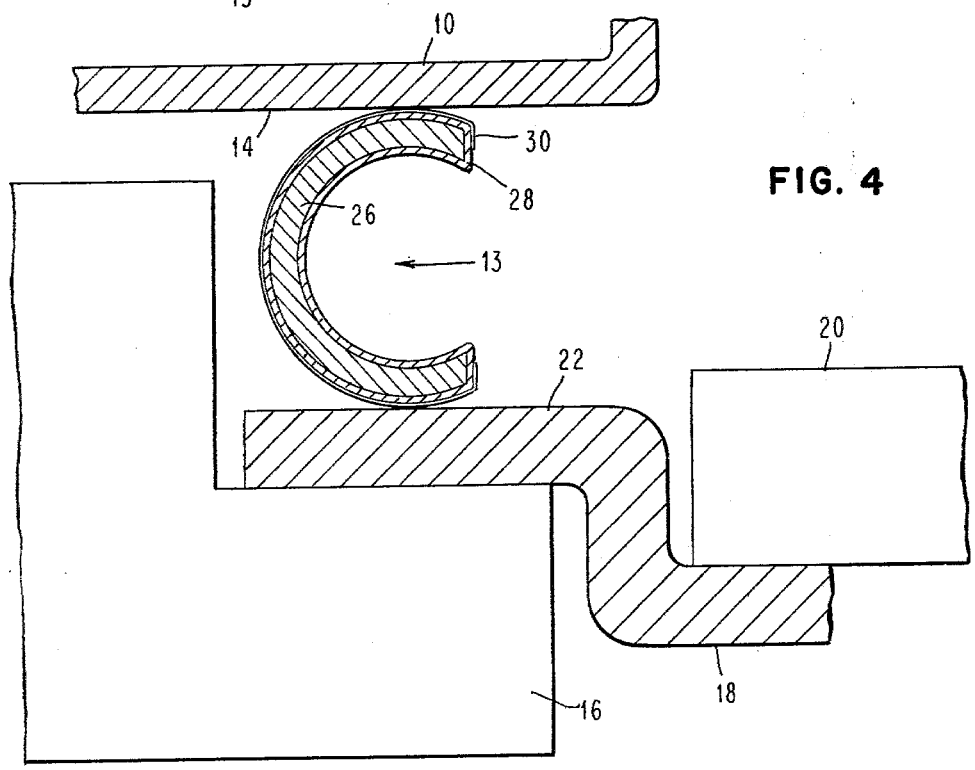
FIG. 4 is a blown-up view of the C-shaped seal ring in the module before the housing halves apply pressure thereto.

A blown-up view is shown in FIG. 4 of the coated C-ring 13 in place in a module before the top part of the housing or cap 10 is forced against the base plate 16. The ductile metal coating 28 is usually plated on with a thickness of 3-5 mils. The organic material 30 is put on as a relatively thin coat. Mitchell Rand wax No. 5 has been found to work very well. The organic material 30 is applied over the outer side of the ductile metal coated C-ring 13 only, so that there is minumum contact and minimum contamination of the contained fluid. It is necessary that a wax or other organic material be compatible and non-contaminating with respect to the fluid contained within the module. The C-shaped ring, with the coatings thereon, diminished in height approximately 26 mils, when squeezed by the adjacent flange surfaces 14 and 22. The resulting surface contact area is relatively flat because of the pressure and resulting cold flow of the ductile metal 28. The bottom flange 18, which extends from the ceramic substrate 20, forming the bottom surface 22 to be sealed is usually gold plated. Similarly, the upper surface 14 to be sealed is gold plated or can be made of aluminum. The pressure applied to the dual coated C-shaped ring 13 by the upper housing surface 14 and the bottom flange surface 22 is approximately 9,000 lbs. per square inch. The pressure is obtained by the use of evenly distributed bolts or screws 32, only one of which is shown, which extend from the upper housing into threaded holes in the bottom housing. Evenly tightening these bolts provides a 9,000 lb. per square inch pressure of the sealing surfaces against the dual coated C-ring 13.

An important feature of the invention is that the seal is breakable and restorable many times without requiring sealing surface refinishing. It is estimated that the seal is makable and restorable ten times without any appreciable change in the sealing characteristics. The seal made as set forth above, is capable of maintaining highly permeable gas, such as helium, within the module for up to ten years with a maximum leak rate of $1 \times 10^{-7}$ ATM-CC/second operating from 0° C. to 100° C.

A uniform film of the organic material 20, for example wax, can be placed in the described areas by heating the C-ring and tracing a stick of the wax over the designated seal surfaces. A piece of filter paper is placed over the wax coating on the C-ring. The absorbant filter paper absorbs the wax at a controlled rate, which is a function of time and temperature, thereby limiting the amount of wax and establishing the uniformity of the coating.

While we have illustrated and described a preferred embodiment of our invention, it is to be understood that we do not limit ourselves to the precise construction herein disclosed and the right is reserved to all changes and modifications coming within the scope of the invention as defined in the appended claims.

Having thus described our invention, what we claim as new, and desire to secure by Letters Patent is:

1. In a gas encapsulated electronic module having a two part housing enclosing a highly permeable gas, a hermetic seal comprising:
   first and second opposing sealing surfaces on said housing;
   a spring metal C-ring located between said first and second surfaces;
   a ductile metal coating on said C-ring adjacent to said first and second surfaces;
   an organic material coating applied to said ductile metal coating between said metal coating and said first and second surfaces;
   means for applying pressure to said coated C-ring by said first and second surfaces, thereby causing said organic material to flow into and fill any micro voids or scratches in said sealing surfaces and causing said ductile metal coating to flow into and fill larger voids and discrepancies in said sealing surfaces to form an impermeable leakage barrier for said highly permeable gas contained within said housing.

2. A hermetic seal according to claim 1, wherein said organic material coating is a wax which forms an impermeable barrier under pressure and does not react with or contaminate said gas.

3. A hermetic seal according to claim 1, wherein said ductile metal coating is lead.

4. A hermetic seal according to claim 1, wherein said first and second opposing surfaces are gold plated.

5. A hermetic seal according to claim 1, wherein said first and second opposing surfaces are aluminum.

6. A hermetic seal according to claim 1, wherein said first and second opposing surfaces are aluminum and gold plated, respectively providing surfaces of materials having different coefficients of expansion.

7. A hermetic seal according to claim 1, wherein said spring metal C-ring is spring steel.

8. A hermetic seal according to claim 1, wherein said means for applying pressure to the coated C-ring by the first and second surfaces to be sealed comprises a plurality of threaded holes in one part of the housing and screws extending from the other part of the housing and dispersed evenly therein for bringing the first and second opposing surfaces together with an evenly distributed pressure.

9. A hermetic seal according to claim 1, wherein said means for applying pressure to the coated C-ring by said first and second surfaces provides a pressure approximately equal to or greater than 9,000 lbs. per square inch.

10. A hermetic seal according to claim 1, wherein the seal is breakable and restorable and can contain helium gas for up to ten years with a maximum leak rate of $1 \times 10^{-7}$ ATM-CC/second operating from 0° C. to 100° C.

* * * * *

Disclaimer 4,261,584.—*Kenneth P. Browne* and *Bernard T. Carr*, Poughkeepsie, and *Edward J. Romanski*, Wappingers Fall, N.Y. HERMETIC SEAL. Patent dated Apr. 14, 1981. Disclaimer filed Jan. 21, 1982, by the assignee, *International Business Machines Corp.*

Hereby enters this disclaimer to claims 1-10 of said patent.

[*Official Gazette March 23, 1982.*]